United States Patent
Motomura et al.

(10) Patent No.: US 8,817,487 B2
(45) Date of Patent: Aug. 26, 2014

(54) ELECTRONIC COMPONENT MOUNTING SYSTEM AND ELECTRONIC COMPONENT MOUNTING METHOD

(75) Inventors: Koji Motomura, Osaka (JP); Hideki Eifuku, Osaka (JP); Tadahiko Sakai, Osaka (JP)

(73) Assignee: Panasonic Corporation, Osaka (JP)

(*) Notice: Subject to any disclaimer, the term of this patent is extended or adjusted under 35 U.S.C. 154(b) by 392 days.

(21) Appl. No.: 13/255,945

(22) PCT Filed: Mar. 24, 2010

(86) PCT No.: PCT/JP2010/002086
§ 371 (c)(1),
(2), (4) Date: Sep. 12, 2011

(87) PCT Pub. No.: WO2010/116637
PCT Pub. Date: Oct. 14, 2010

(65) Prior Publication Data
US 2012/0014084 A1   Jan. 19, 2012

(30) Foreign Application Priority Data

Apr. 7, 2009 (JP) ................................ 2009-092616

(51) Int. Cl.
*H05K 7/02* (2006.01)

(52) U.S. Cl.
USPC ........................................................ 361/807

(58) Field of Classification Search
USPC ........................................................ 361/807
See application file for complete search history.

(56) References Cited

U.S. PATENT DOCUMENTS 4,502,101 A * 2/1985 Jodoin ........................... 361/718
5,715,143 A * 2/1998 McHugh et al. .............. 361/749

(Continued)

FOREIGN PATENT DOCUMENTS

CN  1937909 A  3/2007
CN  101128927 A  2/2008

(Continued)

OTHER PUBLICATIONS

International Search Report for PCT/JP2010/002086 dated Apr. 20, 2010.

*Primary Examiner* — Forrest M Phillips
(74) *Attorney, Agent, or Firm* — Pearne & Gordon LLP

(57) ABSTRACT

Disclosed are an electronic component mounting system and an electronic component mounting method capable of ensuring high connection reliability. An electronic component mounting system (1) includes a component mounting section which includes a solder printing device (M1), a coating/inspection device (M2), a component mounting device (M3), and a reflow device (M4), and mounts an electronic component on a main substrate (4), and a substrate connection section which includes a bonding material supply/substrate mounting device (M5) and a thermal compression device (M6), and connects the main substrate (4) with the component mounted thereon and a module substrate (5) to each other. A configuration is used in which a substrate conveying mechanism (3) of the reflow device (M4) on the lowermost stream side of the component mounting section and a substrate conveying mechanism (3) of the bonding material supply/substrate mounting device (M5) of the substrate connection section are connected directly to each other or are linked to each other by a conveying path through another conveying means. Thus, the main substrate (4) after reflow can be transferred immediately to a substrate connection step, and the generation of a void in the connection portion due to moisture being evaporated in the substrate connection step can be excluded.

4 Claims, 12 Drawing Sheets

(56) References Cited

U.S. PATENT DOCUMENTS

| | | | |
|---|---|---|---|
| 6,239,976 B1 * | 5/2001 | Templeton et al. | 361/737 |
| 6,487,078 B2 * | 11/2002 | Kledzik et al. | 361/704 |
| 8,339,796 B2 * | 12/2012 | Lee et al. | 361/761 |
| 8,379,400 B2 * | 2/2013 | Sunohara | 361/760 |
| 2007/0178279 A1 * | 8/2007 | Ogawa et al. | 428/137 |
| 2008/0202804 A1 | 8/2008 | Fakutomi et al. | |
| 2009/0075025 A1 | 3/2009 | Ozono et al. | |
| 2010/0018048 A1 | 1/2010 | Sakai et al. | |

FOREIGN PATENT DOCUMENTS

| | | |
|---|---|---|
| CN | 101257766 A | 9/2008 |
| JP | 2007-088023 A | 4/2007 |
| JP | 2007-149815 A | 6/2007 |
| JP | 2008-140718 A | 6/2008 |
| JP | 2008-166488 A | 7/2008 |
| JP | 2009-021466 A | 1/2009 |

* cited by examiner

ELECTRONIC COMPONENT MOUNTING SYSTEM AND ELECTRONIC COMPONENT MOUNTING METHOD

TECHNICAL FIELD

The present invention relates to an electronic component mounting system which has a plurality of devices for electronic component mounting connected in series with each other, mounts an electronic component on a first substrate, and connects the first substrate and a second substrate with an electronic component mounted thereon in advance, and an electronic component mounting method in the electronic component mounting system.

BACKGROUND ART

In general, an electronic apparatus, such as a mobile phone, which should have a small size and high performance uses a configuration in which each functional module, such as a CCD camera or a display panel, is connected to a main electronic circuit module provided on a rigid substrate through a filmlike flexible substrate. As a method which connects terminals provided in the flexible substrate to circuit electrodes of the rigid substrate, a method is heretofore used in which electrical conduction is provided between the terminals and the circuit electrodes using an anisotropic conductive adhesive in which conductive particles are contained in thermosetting resin (for example, see PTL 1). In the patent literature example, solder particles are used as the conductive particles, the flexible substrate and the rigid substrate are bonded to each other by thermosetting resin, and the terminals of the flexible substrate are solder-bonded to the circuit board of the rigid substrate to provide electrical conduction.

CITATION LIST

Patent Literature

PTL 1: Japanese Unexamined Patent Application Publication No. 2008-140718

SUMMARY OF INVENTION

Technical Problem

However, in the related art including the above-described patent literature example, there are the following problems due to the step configuration. That is, in the related art, a component mounting step of mounting an electronic component on a rigid substrate and a substrate connection step of connecting a flexible substrate to the rigid substrate with the component mounted thereon are individually performed as individual steps. For this reason, in the component mounting step, the rigid substrate after the reflow ends is stacked until the substrate connection step is performed, and moisture absorption of the rigid substrate occurs during the stacking time. For this reason, in the substrate connection step of the rigid substrate and the flexible substrate, moisture is evaporated and a void is easily generated in the connection portion, causing degradation of connection reliability.

Accordingly, an object of the invention is to provide an electronic component mounting system and an electronic component mounting method capable of ensuring high connection reliability.

Solution to Problem

The invention provides an electronic component mounting system which has a plurality of devices for electronic component mounting connected in series with each other, mounts an electronic component on a first substrate, and connects the first substrate and a second substrate to each other. The plurality of devices for electronic component mounting include a component mounting section which at least includes a solder printing device printing paste for solder bonding on the first substrate, a component mounting device mounting the electronic component on the first substrate with the paste printed thereon, and a reflow device heating the first substrate with the electronic component mounted thereon to solder-bond the electronic component onto the first substrate, and performs a component mounting operation to mount the electronic component on the first substrate while conveying the first substrate along a substrate conveying path formed by connecting substrate conveying mechanisms respectively provided in the plurality of devices for electronic component mounting in series with each other, and a substrate connection section which has a substrate conveying mechanism whose conveying path is linked to the substrate conveying mechanism of the reflow device on the most downstream side in the component mounting section and performs a substrate connection operation to connect the second substrate to the first substrate on which the mounting of the electronic component is completed.

The invention also provides an electronic component mounting method which mounts an electronic component on a first substrate and connects the first substrate and a second substrate to each other. The electronic component mounting method includes a solder printing step of printing paste for solder bonding on the first substrate, a component mounting step of mounting the electronic component on the first substrate with the paste printed thereon, a reflow step of heating the first substrate with the electronic component mounted thereon to solder-bond the electronic component onto the first substrate, and a substrate connection step of connecting the second substrate to the first substrate on which the mounting of the electronic component is completed by the reflow step. The solder printing step, the component mounting step, and the reflow step are performed by a component mounting section which is constituted by the same electronic component mounting line, and the substrate connection step is performed by a substrate connection section which has a substrate conveying mechanism whose conveying path is linked to a substrate conveying mechanism of a reflow device on the most downstream side in the component mounting section.

Advantageous Effects Of Invention

According to the invention, the substrate conveying mechanism of the component mounting section which performs the component mounting operation to mount the electronic component on the first substrate and the substrate conveying mechanism of the substrate connection section which performs the substrate connection operation to connect the second substrate to the first substrate on which the mounting of the electronic component is completed are linked to each other by the conveying path. Therefore, in the component mounting step, the first substrate can be transferred to the substrate connection step immediately after reflow ends, and in the substrate connection step, the generation of a void in the connection portion due to moisture being evaporated can be excluded, thereby ensuring high connection reliability.

DESCRIPTION OF EMBODIMENTS

Figure 1:
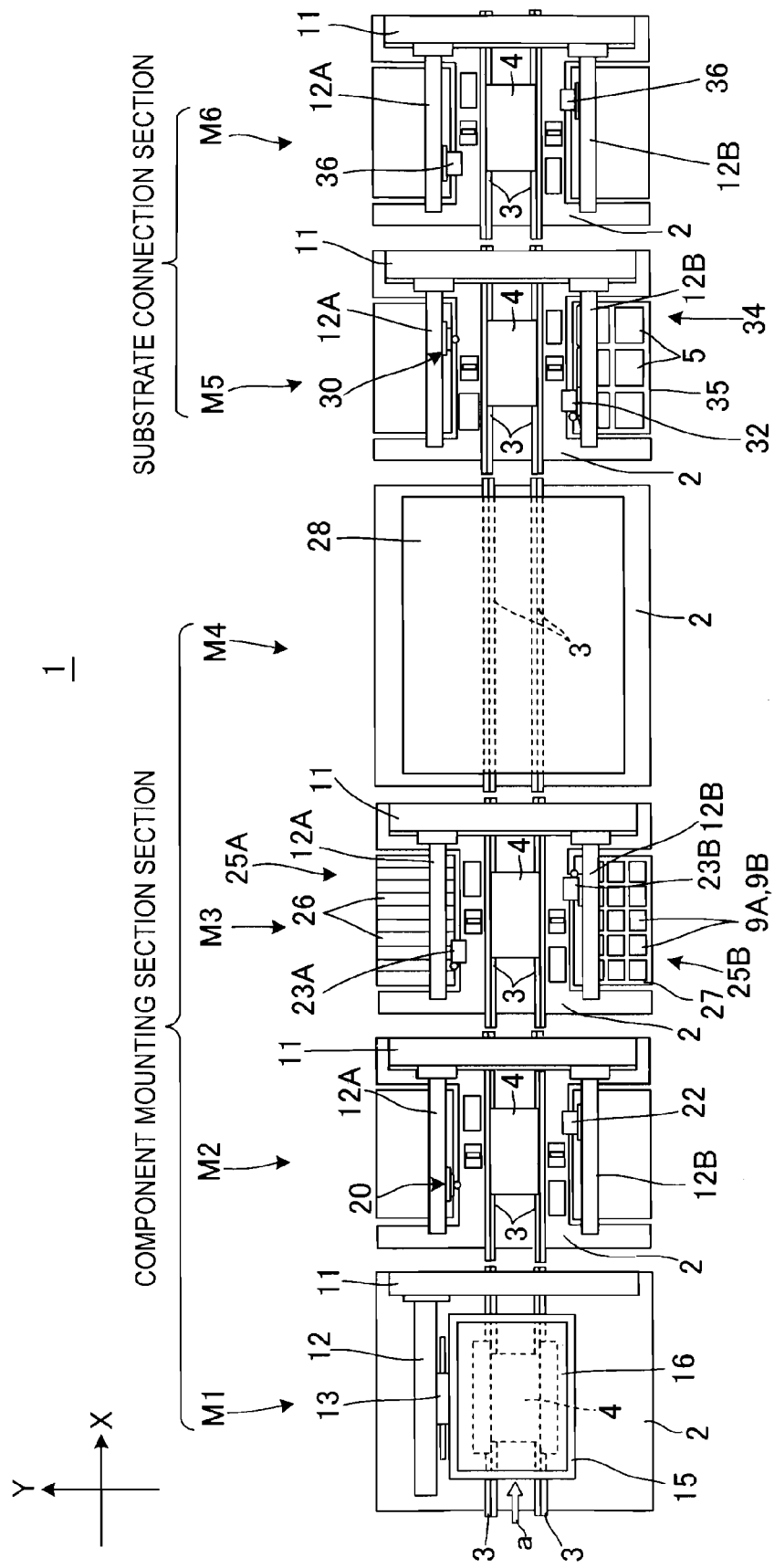
FIG. 1 is a plan view showing the configuration of an electronic component mounting system according to an embodiment of the invention.
Figure 2:
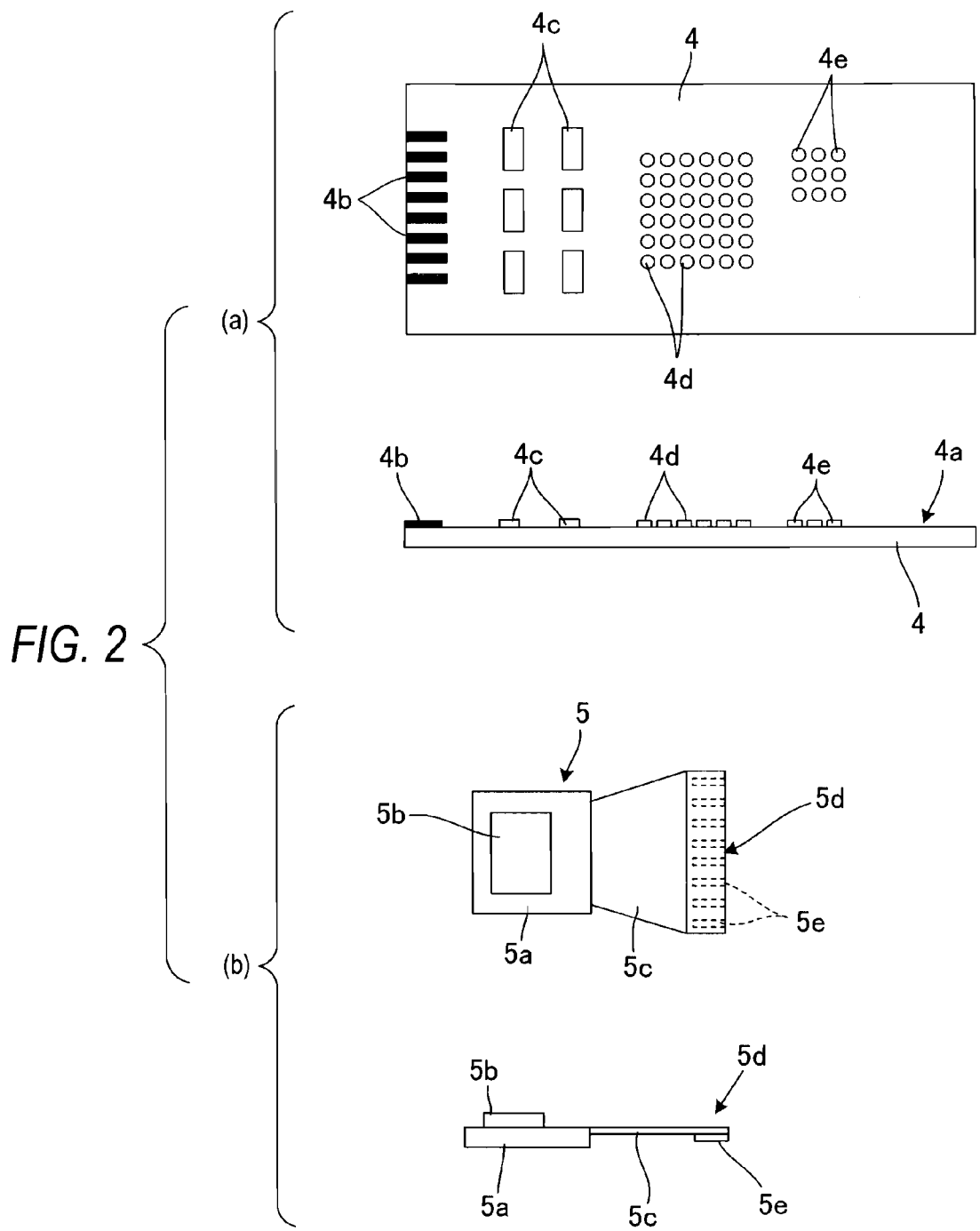
FIGS. 2(a) and (b) are explanatory views of a substrate as a mounting target of the electronic component mounting system according to an embodiment of the invention.
Figure 3:
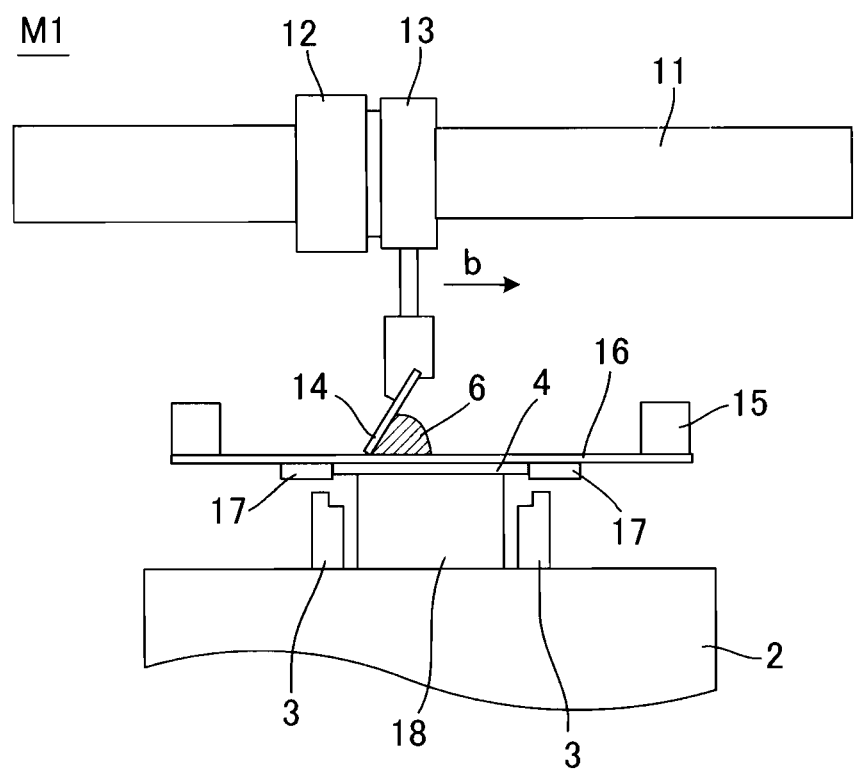
FIG. 3 is a partial sectional view of a solder printing device which constitutes the electronic component mounting system according to an embodiment of the invention.
Figure 4:
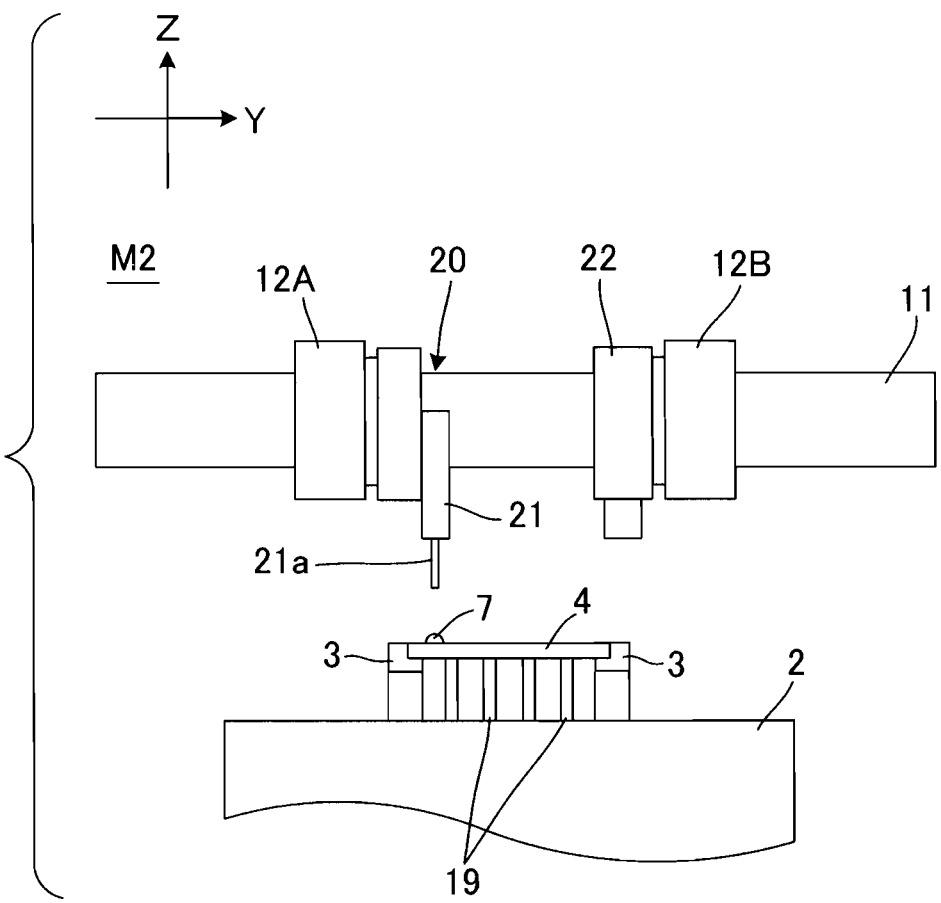
FIG. 4 is a partial sectional view of a coating/inspection device which constitutes the electronic component mounting system according to an embodiment of the invention.
Figure 5:
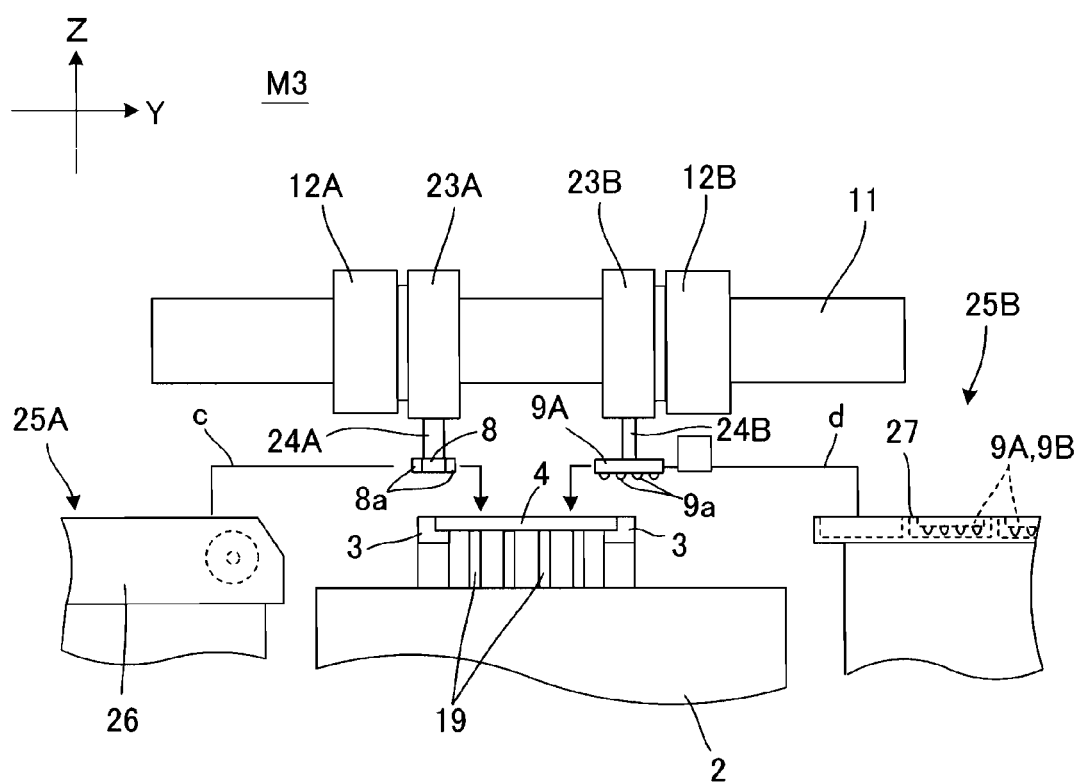
FIG. 5 is a partial sectional view of an electronic component mounting device which constitutes the electronic component mounting system according to an embodiment of the invention.
Figure 6:
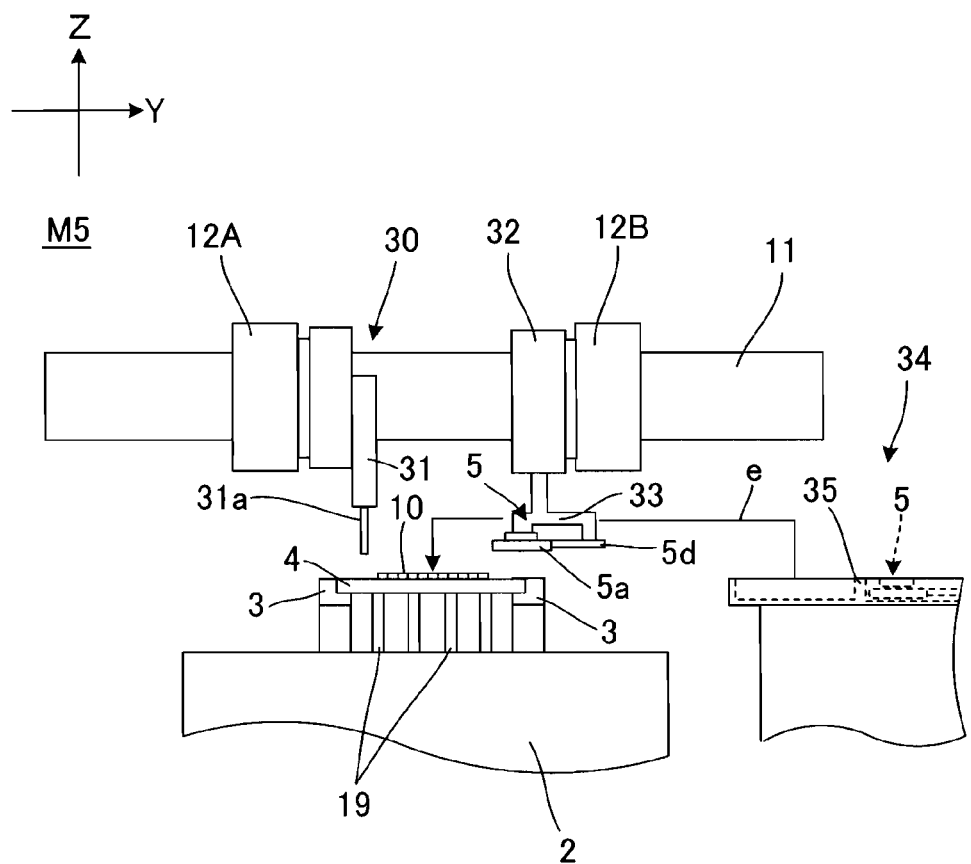
FIG. 6 is a partial sectional view of a bonding material supply/substrate mounting device which constitutes the electronic component mounting system according to an embodiment of the invention.
Figure 7:
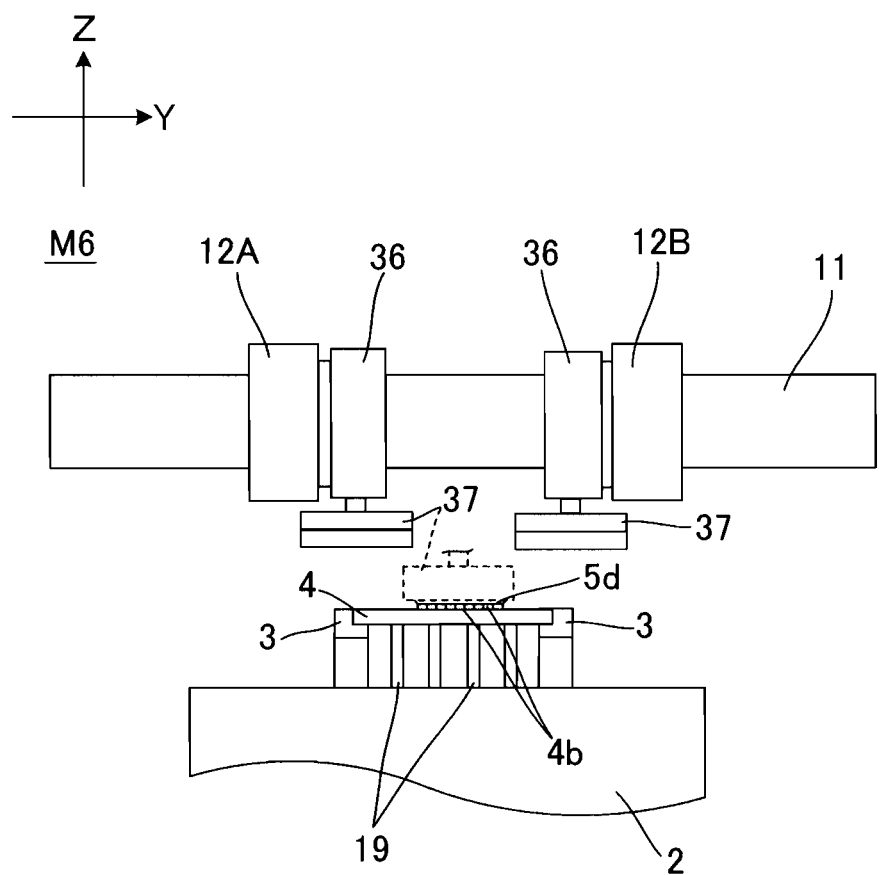
FIG. 7 is a partial sectional view of a thermal compression device which constitutes the electronic component mounting system according to an embodiment of the invention.

Next, an embodiment of the invention will be described with reference to the drawings. FIG. 1 is a plan view showing the configuration of an electronic component mounting system according to an embodiment of the invention. FIG. 2 is an explanatory view of a substrate as a mounting target of the electronic component mounting system according to an embodiment of the invention. FIG. 3 is a partial sectional view of a solder printing device which constitutes the electronic component mounting system according to an embodiment of the invention. FIG. 4 is a partial sectional view of a coating/inspection device which constitutes the electronic component mounting system according to an embodiment of the invention. FIG. 5 is a partial sectional view of a component mounting device which constitutes the electronic component mounting system according to an embodiment of the invention. FIG. 6 is a partial sectional view of a bonding material supply/substrate mounting device which constitutes the electronic component mounting system according to an embodiment of the invention. FIG. 7 is a partial sectional view of a thermal compression device which constitutes the electronic component mounting system according to an embodiment of the invention. FIGS. 8, 9, 10, 11, and 12 are process explanatory views of an electronic component mounting method in the electronic component mounting system according to an embodiment of the invention.

First, the configuration of an electronic component mounting system 1 will be described with reference to FIG. 1. The electronic component mounting system 1 has a configuration in which a solder printing device M1, a coating/inspection device M2, a component mounting device M3, a reflow device M4, a bonding material supply/substrate mounting device M5, and a thermal compression device M6 as a plurality of devices for electronic component mounting are connected in series with each other. Each device includes a substrate conveying mechanism 3 which is arranged in the X direction (substrate conveying direction) in the central portion of a base 2, and the substrate conveying mechanism 3 of each device is connected in series with the substrate conveying mechanism 3 of an adjacent device to form a substrate conveying path which passes through the electronic component mounting system 1 vertically. A main substrate 4 on which an electronic component will be mounted is sequentially carried in the substrate conveying mechanism 3 of the solder printing device M1 from the upstream side (the left side of FIG. 1, see arrow a) and sequentially conveyed in the X direction inside the electronic component mounting system 1.

Next, a main substrate 4 and a module substrate 5 as an operation target of the electronic component mounting system 1 will be described with reference to FIG. 2. FIG. 2(a) shows the main substrate 4 (first substrate) on which an electronic component will be mounted. A module substrate 5 (second substrate) shown in FIG. 2(b) is connected to the main substrate 4. The main substrate 4 and the module substrate 5 constitute an electronic circuit of a small terminal apparatus, such as a mobile phone, and are mounted in a casing in a state where the module substrate 5 is connected to the main substrate 4.

The main substrate 4 is made of glass epoxy resin. As shown in FIG. 2(a), a plurality of connection terminals 4b (first connection portion) which are located at one edge and used to connect the module substrate 5 are formed in a mounting surface 4a of the main substrate 4. In the central portion of the mounting surface 4a, electrodes 4c, 4d, and 4e to which the terminals of an electronic component will be connected are formed. Terminals 8a formed in the end portions of a chip-type component 8 and bumps 9a formed in the lower surfaces of bump-equipped components 9A and 9B are respectively solder-bonded to the electrodes 4c, 4d, and 4e (see FIGS. 9 and 10). FIG. 2(b) shows the module substrate 5. The module substrate 5 has a configuration in which a flexible substrate 5c is connected in advance to a sub substrate 5a on which an electronic component 5b for a driver is mounted in advance. In the lower surface of a connection end portion 5d of the flexible substrate 5c, flexible terminals 5e (second connection portion) which will be connected to the connection terminal 4b of the main substrate 4 are formed.

Next, the structure and functions of each device will be described. First, the solder printing device M1 will be described with reference to FIGS. 1 and 3. The solder printing device M1 has a function of printing a cream solder as paste for solder bonding on the main substrate 4. As shown in FIG. 3, a substrate conveying mechanism 3 is provided with a substrate underhung portion 18 which is movable up and down, and a mask plate 16 which is extended to a mask frame 15 is provided above the substrate conveying mechanism 3. The main substrate 4 conveyed from the upstream side by the substrate conveying mechanism 3 comes into contact with the lower surface of the mask plate 16 in a state where the lower surface of the main substrate 4 is underhung by the substrate underhung portion 18 and the main substrate 4 is further clamped from both sides by a clamp member 17.

In the end portion of a base 2 in the X direction, a Y-axis table 11 is arranged in the Y direction. If the Y-axis table 11 is driven, an X-axis beam 12 mounted on the Y-axis table 11 reciprocates in the Y direction. A skew unit 13 having a skew member 14 is mounted in the lower end portion of the X-axis beam 12. If the skew unit 13 is driven, the skew member 14 moves up and down, and in a state where the skew member 14 moves down, the lower end portion of the skew member 14 comes into contact with the upper surface of the mask plate 16. A cream solder 6 is supplied onto the mask plate 16, and in a state where the skew member 14 further moves down, the Y-axis table 11 is driven to move the skew unit 13 in the Y direction (arrow b). Thus, the cream solder 6 is printed on the electrodes 4c, 4d, and 4e provided in the main substrate 4 through pattern holes (not shown) provided to correspond to the electrodes 4c, 4d, and 4e in the mask plate 16 (see FIG. 8).

Next, the coating/inspection device M2 will be described with reference to FIGS. 1 and 4. The coating/inspection device M2 has a function of inspecting the printed state of the cream solder 6 printed on the main substrate 4 by the solder printing device M1 and coating an adhesive 7 for temporary component fixing on the main substrate 4. As shown in FIG. 4, a substrate conveying mechanism 3 is provided with a substrate underhung pin 19 which is movable up and down. The lower side of the main substrate 4 conveyed from the upstream side by the substrate conveying mechanism 3 is underhung by the substrate underhung pin 19. Above the substrate conveying mechanism 3 are provided a coating unit 20 which is movable in the X direction by a first X-axis table 12A and an inspection unit 22 which is movable in the X direction by a second X-axis table 12B.

In the coating unit 20, a dispenser 21 having a coating nozzle 21a in the lower end portion is mounted to be movable up and down. In a state where the dispenser 21 moves down and the coating nozzle 21a comes close to the upper surface of the main substrate 4, an ejection mechanism embedded in the dispenser 21 is activated, such that an adhesive 7 is ejected from the coating nozzle 21a and coated on the main substrate 4. The inspection unit 22 has a function of imaging the main substrate 4 therebelow, and performs recognition processing on the imaging result by a recognition processing section (not shown) to inspect the printed state of the cream solder 6 printed on the main substrate 4.

In the end portion of a base 2 in the X-direction, a Y-axis table 11 is arranged in the Y direction, and a first X-axis table 12A and a second X-axis table 12B are individually mounted on the Y-axis table 11 to be movable in the Y direction. If the Y-axis table 11 is driven, the first X-axis table 12A and the second X-axis table 12B reciprocate individually in the Y direction. The movement in the Y direction and the movement in the X direction by the first X-axis table 12A and the second X-axis table 12B are combined, such that the coating unit 20 and the inspection unit 22 respectively move in the X direction and the Y direction with respect to the main substrate 4 aligned therebelow. Thus, the coating unit 20 can coat the adhesive 7 at an arbitrary point of the main substrate 4, and the coating unit 20 can inspect the printed state of the cream solder 6 at an arbitrary position of the main substrate 4.

Next, the component mounting device M3 will be described with reference to FIGS. 1 and 5. The component mounting device M3 has a function of mounting an electronic component on the main substrate 4 with the cream solder 6 printed thereon. As shown in FIG. 5, a substrate conveying mechanism 3 is provided with a substrate underhung pin 19 which is movable up and down. The lower surface of the main substrate 4 conveyed from the upstream side by the substrate conveying mechanism 3 is underhung by the substrate underhung pin 19. A first component supply section 25A and a second component supply section 25B are provided on both sides of the substrate conveying mechanism 3.

The first component supply section 25A is provided with a plurality of tape feeders 26 arranged in parallel. The tape feeders 26 feed a carrier tape, which stores comparatively small electronic components, such as the chip-type component 8, pitch by pitch by an embedded tape feed mechanism to supply the electronic components to a component extraction position of a first mounting head 23A described below. In the second component supply section 25B, a component tray 27 is arranged which stores comparatively large components, such as the bump-equipped components 9A and 9B with bumps formed in the lower surface, in a predetermined regular arrangement. A second mounting head 23B described below accesses the component storage position of the component tray 27 to extract the electronic components from the component tray 27.

In the end portion of a base 2 in the X direction, a Y-axis table 11 is provided in the Y direction, and a first X-axis table 12A and a second X-axis table 12B are individually mounted on the Y-axis table 11 to be movable in the Y direction. A first mounting head 23A and a second mounting head 23B which respectively include a first absorption nozzle 24A and a second absorption nozzle 24B in the lower end portion are respectively mounted in the first X-axis table 12A and the second X-axis table 12B. The first mounting head 23A absorbs and holds the chip-type component 8 by the first absorption nozzle 24A, and the second mounting head 23B absorbs and holds the bump-equipped component 9A and the bump-equipped component 9B by the second absorption nozzle 24B.

If the Y-axis table 11 is driven, the first X-axis table 12A and the second X-axis table 12B reciprocate individually in the Y direction. The movement in the Y direction and the movement in the X direction by the first X-axis table 12A and the second X-axis table 12B are combined, such that the first mounting head 23A and the second mounting head 23B respectively move freely between the first component supply section 25A and the second component supply section 25B, and the main substrate 4 aligned in the substrate conveying mechanism 3. Thus, the first mounting head 23A mounts the chip-type component 8 extracted from the tape feeder 26 of the first component supply section 25A at an arbitrary mounting position of the main substrate 4 (arrow c). The second absorption nozzle 24B mounts the bump-equipped components 9A and 9B extracted from the component tray 27 of the second component supply section 25B at arbitrary mounting positions of the main substrate 4 (arrow d).

Next, the reflow device M4 will be described with reference to FIG. 1. The reflow device M4 has a function of heating the main substrate 4 with the electronic components, such as the chip-type component 8 (see FIG. 5) and the bump-equipped components 9A and 9B, mounted thereon to solder-bond the electronic components onto the main substrate 4. On the main substrate 4, a heating furnace 28 including a heater is arranged, and inside the heating furnace 28, a substrate conveying mechanism 3 is provided to vertically pass through the heating furnace 28 in the X direction. The heating furnace 28 includes a temperature control mechanism. The main substrate 4 with the components mounted thereon carried in the heating furnace 28 is heated in accordance with a predetermined temperature profile while being conveyed to the downstream side by the substrate conveying mechanism 3.

Thus, the cream solder 6 supplied onto the electrodes 4c, 4d, and 4e of the main substrate 4 is molten and solidified, and the terminals 8a of the chip-type component 8 or the bumps 9a of the bump-equipped components 9A and 9B are respectively solder-bonded to the electrodes 4c, 4d, and 4e. In this way, the component mounting operation on the main substrate 4 is completed. That is, the solder printing device M1, the coating/inspection device M2, the component mounting device M3, and the reflow device M4 constitute a component mounting section which performs a component mounting operation to mount the electronic components on the main substrate 4 while conveying the main substrate 4 along a substrate conveying path formed by connecting the substrate conveying mechanism 3 respectively provided in the devices for electronic component mounting in series with each other.

The substrate conveying mechanism 3 of the reflow device M4 on the most downstream side in the component mounting section is connected to the substrate conveying mechanism 3 of the bonding material supply/substrate mounting device M5 described below, such that the main substrate 4 on which the component mounting operation is completed can be transferred immediately to the bonding material supply/substrate mounting device M5 without delay. As shown in FIG. 1, instead of connecting the substrate conveying mechanism 3 of the reflow device M4 and the substrate conveying mechanism 3 of the bonding material supply/substrate mounting device MS directly to each other, another conveying mechanism may be interposed between the substrate conveying mechanism 3 of the reflow device M4 and the substrate conveying mechanism 3 of the bonding material supply/substrate mounting device M5.

In summary, it should suffice that the conveying paths of the substrate conveying mechanism 3 of the reflow device M4 on the most downstream side in the component mounting section and the substrate conveying mechanism 3 of the bonding material supply/substrate mounting device MS are linked to each other through any automatic conveying means, such as a connection conveyer, such that the main substrate 4 on which the component mounting operation is completed can be transferred to the subsequent substrate connection operation.

Next, the bonding material supply/substrate mounting device MS will be described with reference to FIGS. 1 and 6. The bonding material supply/substrate mounting device M5 has a function of supplying a bonding material 10, in which solder particles are contained in thermosetting resin, in a predetermined range on a plurality of connection terminals 4b provided in the main substrate 4 so as to mount the module substrate 5 on the main substrate 4, and a function of mounting the module substrate 5 on the main substrate 4 to land the connection end portion 5d of the module substrate 5 on the connection terminals 4b through the bonding material 10.

In the end portion of a base 2 in the X direction, a Y-axis table 11 is provided in the Y direction, and a first X-axis table 12A and a second X-axis table 12B are individually mounted on the Y-axis table 11 to be movable in the Y direction. As shown in FIG. 6, above a substrate conveying mechanism 3, a bonding material coating unit 30 is provided to be movable in the X direction by the first X-axis table 12A, and a mounting head 32 is provided to be movable in the X direction by the second X-axis table 12B. In the bonding material coating unit 30, a dispenser 31 which includes a coating nozzle 31a in the lower end portion is mounted to be movable up and down.

In a state where the dispenser 31 moves down and the coating nozzle 31a comes close to the upper surface of the main substrate 4, an ejection mechanism embedded in the dispenser 31 is activated, such that the bonding material 10 is ejected from the coating nozzle 31a and coated on the main substrate 4. The bonding material 10 has a composition in which solder particles are contained in thermosetting resin, such as epoxy resin, and an active component having an action to remove an oxide film generated in the surfaces of the solder particles or the connection terminals 4b as a bonding target is mixed.

The mounting head 32 includes an absorption tool 33 having a special shape in the lower end portion, and the absorption tool 33 is configured to absorb and hold the module substrate 5 shown in FIG. 2(b) by two absorption portions 33a and 33b (see FIG. 11(b)). Laterally to the substrate conveying mechanism 3, a substrate supply section 34 is provided in which a substrate storage tray 35 storing the module substrate 5 in a regular arrangement is arranged. The mounting head 32 accesses the substrate supply section 34 to extract the module substrate 5 by the absorption tool 33. The absorption tool 33 includes a heating function to heat the module substrate 5. In FIG. 6, for convenience, the holding posture of the module substrate 5 by the absorption tool 33 is rotated by 90 degrees around the vertical axis from the actual holding posture.

If the Y-axis table 11 is driven, the first X-axis table 12A and the second X-axis table 12B reciprocate individually in the Y direction. The movement in the Y direction and the movement in the X direction by the first X-axis table 12A and the second X-axis table 12B are combined, such that the bonding material coating unit 30 and the mounting head 32 respectively move in the X direction and the Y direction with respect to the main substrate 4 aligned therebelow. Thus, the bonding material coating unit 30 supplies the bonding material 10 onto the mounting surface 4a formed in the edge portion of the main substrate 4 through coating. The mounting head 32 can land the connection end portion 5d of the module substrate 5 extracted from the substrate storage tray 35 of the substrate supply section 34 on the connection terminals 4b of the main substrate 4 through the bonding material 10 (arrow e). Although in the example shown in FIG. 6, as the method of supplying the bonding material 10 onto the connection terminals 4b (see FIG. 2), a method is used in which the bonding material 10 is coated by the bonding material coating unit 30, a method may be used in which the bonding material 10 is molded in advance in a sheet shape and the sheet is attached onto the connection terminals 4b.

Next, the thermal compression device M6 will be described with reference to FIGS. 1 and 7. The thermal compression device M6 has a function of heating the main substrate 4 with the module substrate 5 mounted thereon by the bonding material supply/substrate mounting device M5 to bond the flexible terminals 5e serving as a second connection portion and the connection terminals 4b serving as a first connection portion together by the bonding material 10. In the end portion of a base 2 in the X direction, a Y-axis table 11 is arranged in the Y direction, and a first X-axis table 12A and a second X-axis table 12B are individually mounted on the Y-axis table 11 to be movable in the Y direction.

As shown in FIG. 7, a heating head 36 is mounted in each of the first X-axis table 12A and the second X-axis table 12B, and includes a heating tool 37 which is movable up and down in the lower end portion. The heating tool 37 is embedded with a heating mechanism. The heating tool 37 heated to a predetermined temperature moves down with respect to the main substrate 4 and comes into contact with the upper surface of the connection end portion 5d mounted on the connection terminals 4b through the bonding material 10 (see FIG. 12). Thus, the bonding material 10 is heated and the connection terminals 4b are bonded to the flexible terminals 5e.

At this time, the solder component contained in the bonding material 10 is molten and interposed in the bonding surface of the connection terminals 4b and the connection end portion 5d, such that electrical conduction is ensured between the connection terminals 4b and the flexible terminals 5e. The thermosetting resin, such as epoxy resin, which constitutes the bonding material 10 is thermally set by heating, such that the connection end portion 5d is fixed to the mounting surface 4a of the main substrate 4.

That is, in the above description, the Y-axis table 11, the first X-axis table 12A, and the bonding material coating unit 30 constitute a bonding material supply section which supplies the bonding material 10, in which solder particles are contained in thermosetting resin, to the connection terminals 4b serving as a first connection portion provided in the main substrate 4 serving as a first substrate. The Y-axis table 11, the second X-axis table 12B, and the mounting head 32 constitute a substrate mounting section which mounts the module substrate 5 serving as a second substrate on the main substrate 4 serving as a first substrate to land the flexible terminals 5e provided in the module substrate 5 on the connection terminals 4b through the bonding material 10.

The thermal compression device M6 including the heating head 36 and the heating tool 37 constitutes a heating section which heats the module substrate 5 with the main substrate 4 mounted thereon to bond the flexible terminals 5e and the connection terminals 4b together by the bonding material 10. That is, the bonding material supply/substrate mounting device M5 and the thermal compression device M6 constitute a substrate connection section which has the substrate conveying mechanism 3 whose conveying path is linked to the substrate conveying mechanism 3 of the reflow device M4 on the most downstream side in the above-described component mounting section, and performs the substrate connection operation to connect the module substrate 5 to the main substrate 4 on which the mounting of the electronic components is completed. As the heating section in the substrate connection section, instead of using a thermal compression system, such as the thermal compression device M6, a reflow device may be used which can melt the solder component in the bonding material 10 and set an atmosphere temperature to a temperature at which the thermosetting reaction of the thermosetting resin progresses.

Figure 8:
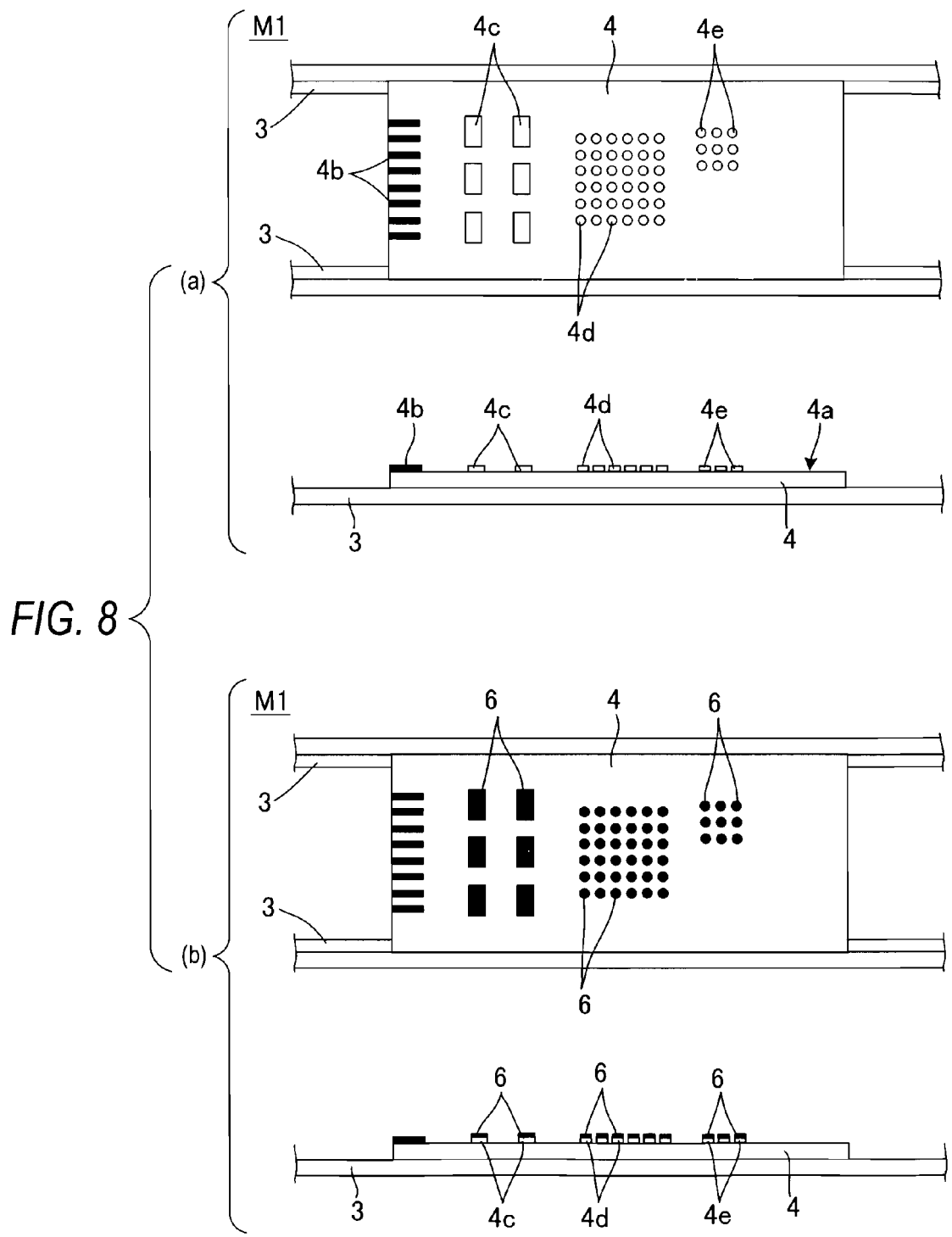
FIGS. 8(a) and (b) are process explanatory views of an electronic component mounting method in the electronic component mounting system according to an embodiment of the invention.
Figure 9:
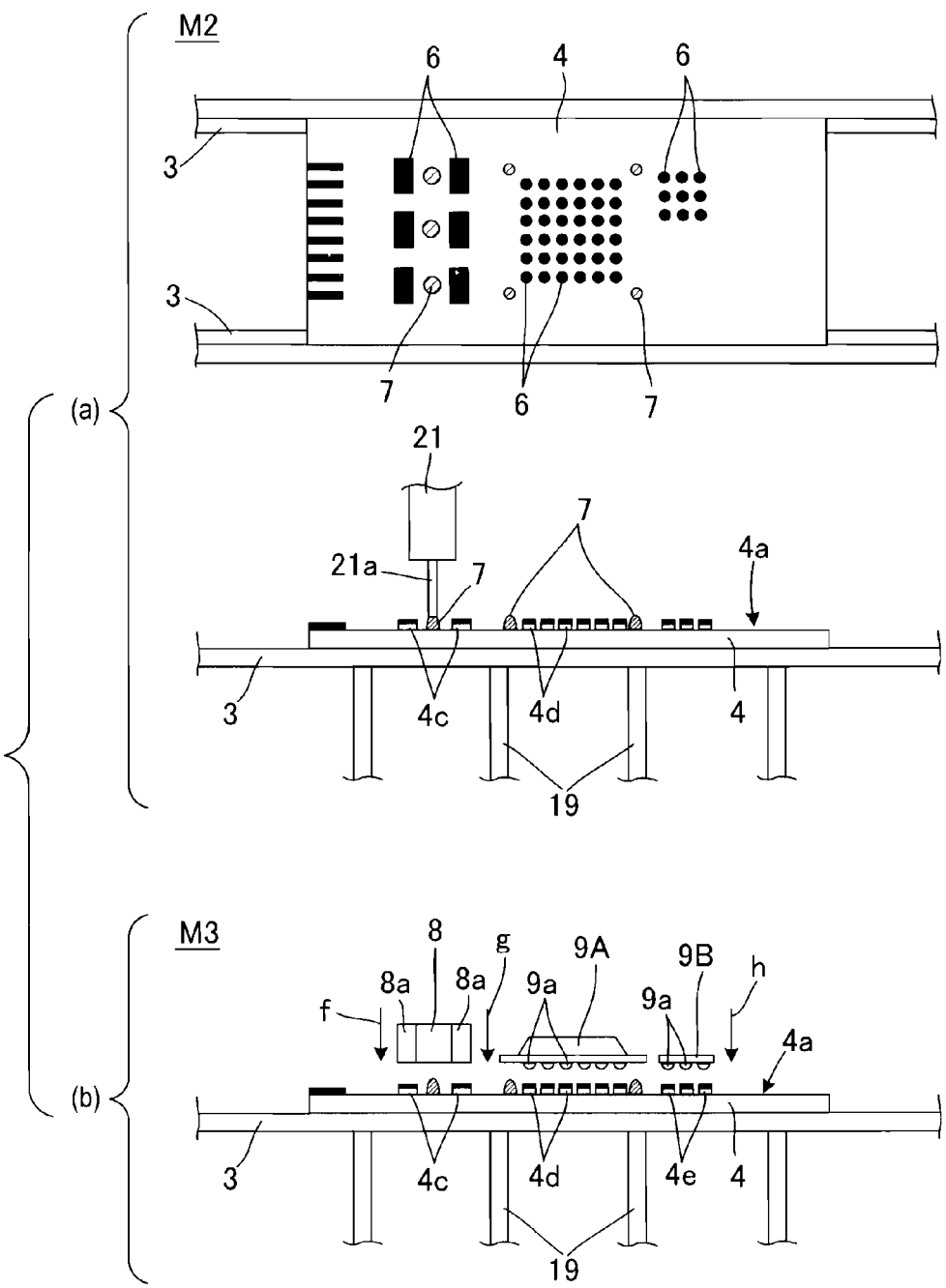
FIGS. 9(a) and (b) are process explanatory views of the electronic component mounting method in the electronic component mounting system according to an embodiment of the invention.
Figure 10:
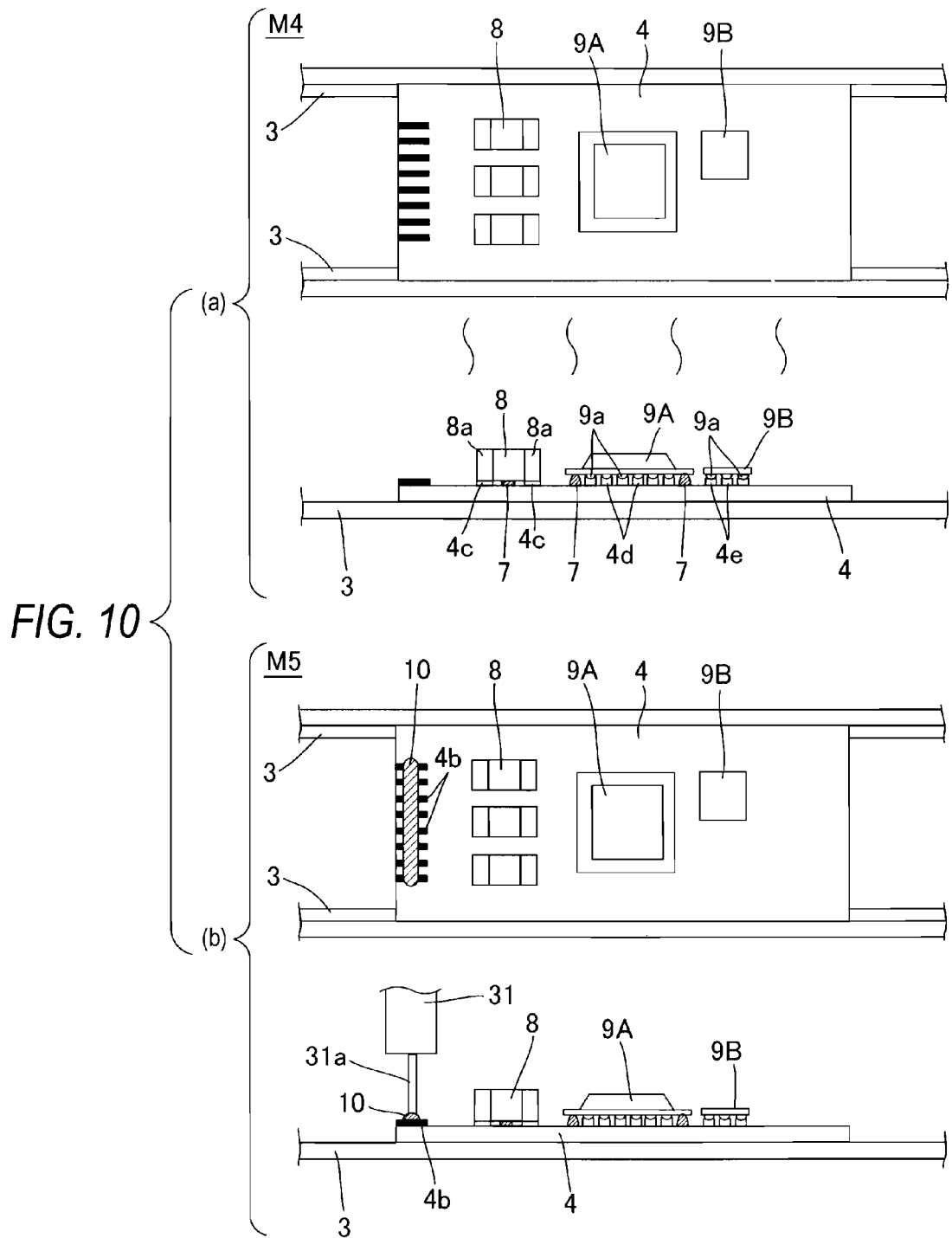
FIGS. 10(a) and (b) are process explanatory views of the electronic component mounting method in the electronic component mounting system according to an embodiment of the invention.
Figure 11:
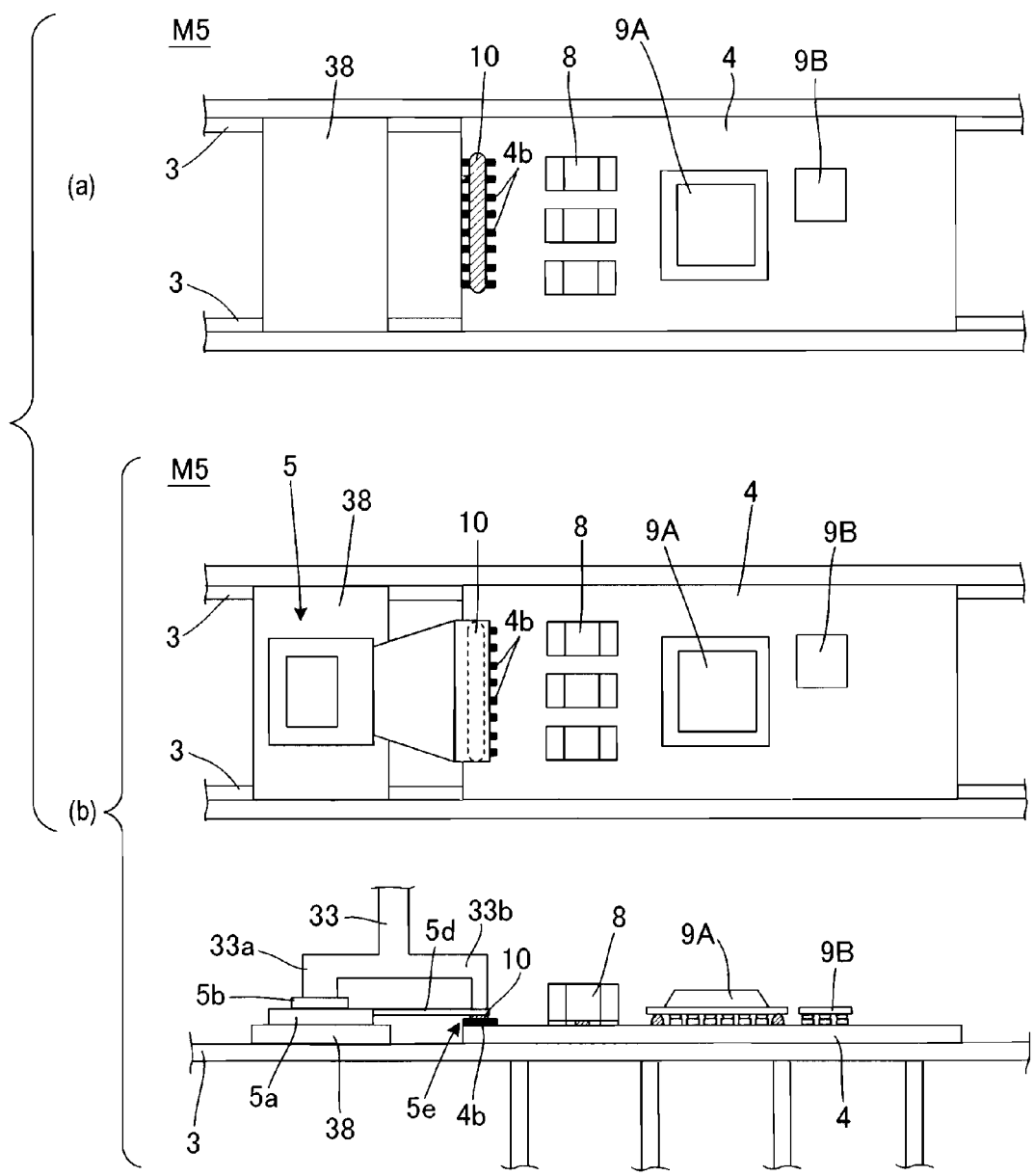
FIGS. 11(a) and (b) are process explanatory views of the electronic component mounting method in the electronic component mounting system according to an embodiment of the invention.

Next, an electronic component mounting method which mounts an electronic component on the main substrate 4 serving as a first substrate and connects the main substrate 4 and the module substrate 5 serving as a second substrate to each other by the electronic component mounting system 1 configured as above will be described with reference to FIGS. 8 to 12. First, FIG. 8(a) shows the main substrate 4 carried in the substrate conveying mechanism 3 of the solder printing device M1. That is, a plurality of connection terminals 4b which are located in one edge portion and used to connect the module substrate 5 are formed in the mounting surface 4a of the main substrate 4, and the electrodes 4c, 4d, and 4e to which the terminals of the electronic component will be connected are formed in the central portion of the mounting surface 4a. Next, the main substrate 4 is carried in the solder printing device M1, and the cream solder 6 for solder bonding is printed on the main substrate 4 (solder printing step). Thus, as shown in FIG. 8(b), the cream solder 6 is supplied onto the upper surfaces of the electrodes 4c, 4d, and 4e at a predetermined thickness.

Next, the main substrate 4 with the solder printed thereon is carried in the coating/inspection device M2, and the adhesive 7 is coated by the coating unit 20. That is, as shown in FIG. 9(a), the dispenser 21 moves down with respect to the main substrate 4, and the adhesive 7 for temporary component fixing is sequentially coated at a plurality of coating points set in advance by the coating nozzle 21a for each component mounting device. Simultaneously, in the coating/inspection device M2, the main substrate 4 is imaged by the inspection unit 22 to inspect the solder printed state.

Thereafter, the main substrate 4 is carried in the component mounting device M3, and a component mounting operation to mount an electronic component is performed on the main substrate 4 with the cream solder 6 printed thereon by the first mounting head 23A and the second mounting head 23B (component mounting step). That is, as shown in FIG. 9(b), the terminals 8a of the chip-type component 8 move down and are landed on the electrodes 4c (arrow f), the bumps 9a of the bump-equipped component 9A move down and are landed on the electrodes 4d (arrow g), and the bumps 9a of the bump-equipped component 9B move down and are landed on the electrodes 4e (arrow h).

Thereafter, the main substrate 4 with the components mounted thereon is carried in the reflow device M4. Then, the main substrate 4 with the electronic components, such as the chip-type component 8 and the bump-equipped components 9A and 9B, mounted thereon is heated to solder-bond the electronic components onto the main substrate 4 (reflow step). Accordingly, the terminals 8a of the chip-type component 8 are solder-bonded to the electrodes 4c, and the bumps 9a of the bump-equipped components 9A and 9B are respectively solder-bonded to the electrodes 4d and 4e. Thus, the component mounting operation to mount and solder-bond the electronic components, such as the chip-type component 8 and the bump-equipped components 9A and 9B, on the main substrate 4 is completed. In this embodiment, the solder printing step, the component mounting step, and the reflow step in the component mounting operation are performed by the component mounting section (the solder printing device M1 to the reflow device M4) which is constituted by the same electronic component mounting line.

The main substrate 4 on which the mounting of the electronic component is completed in the above-described manner is transferred to the substrate connection section which includes the bonding material supply/substrate mounting device M5 and the thermal compression device M6. In the substrate connection section, the module substrate 5 is connected to the main substrate 4 (substrate connection step). The substrate connection section in which the substrate connection step is performed has the substrate conveying mechanism 3 whose conveying path is linked to the substrate conveying mechanism 3 of the reflow device M4 on the most downstream side in the component mounting section. The main substrate 4 after reflow is carried immediately in the bonding material supply/substrate mounting device M5 without being stacked.

In the bonding material supply/substrate mounting device M5, first, the bonding material 10 in which solder particles are contained in thermosetting resin is supplied to the connection terminals 4b serving as a first connection portion to the module substrate 5 in the main substrate 4 (bonding material supply step). That is, as shown in FIG. 10(b), first, the bonding material 10 is coated in a predetermined range on the connection terminals 4b of the carried-in main substrate 4. The dispenser 31 moves down above the connection terminals 4b, and the dispenser 31 moves in the Y direction while the bonding material 10 is ejected from the coating nozzle 31a, such that the bonding material 10 is coated on the connection terminals 4b.

Next, the module substrate 5 is mounted on the main substrate 4 to land the flexible terminals 5e provided in the module substrate 5 on the connection terminals 4b through the bonding material 10 (substrate mounting step). As shown in FIG. 11(a), first, a holding jig 38 for supporting the sub substrate 5a of the module substrate 5 from below is placed at a position adjacent to the main substrate 4 in the substrate conveying mechanism 3. Next, the module substrate 5 is extracted from the substrate supply section 34 by the absorption tool 33, and as shown in FIG. 11(b), alignment is performed to connect the module substrate 5 to the main substrate 4.

The absorption tool 33 includes two branched absorption portions 33a and 33b, and the electronic component 5b mounted on the sub substrate 5a is absorbed and held by the absorption portion 33a, and the connection end portion of the flexible substrate 5c extending from the sub substrate 5a is absorbed and held by the absorption portion 33b. Thus, it becomes possible to hold the module substrate 5, which has a complex shape and is not easily held stably by a normal method, in a correct posture. With regard to the alignment of the main substrate 4 and the module substrate 5, the sub substrate 5a absorbed and held by the absorption portion 33a is placed on the holding jig 38, and the connection end portion 5d absorbed and held by the absorption portion 33b is landed on the connection terminals 4b through the bonding material 10. Thus, the flexible terminals 5e (FIG. 2) formed in the lower surface of the connection end portion 5d come close to the surfaces of the connection terminals 4b.

Figure 12:
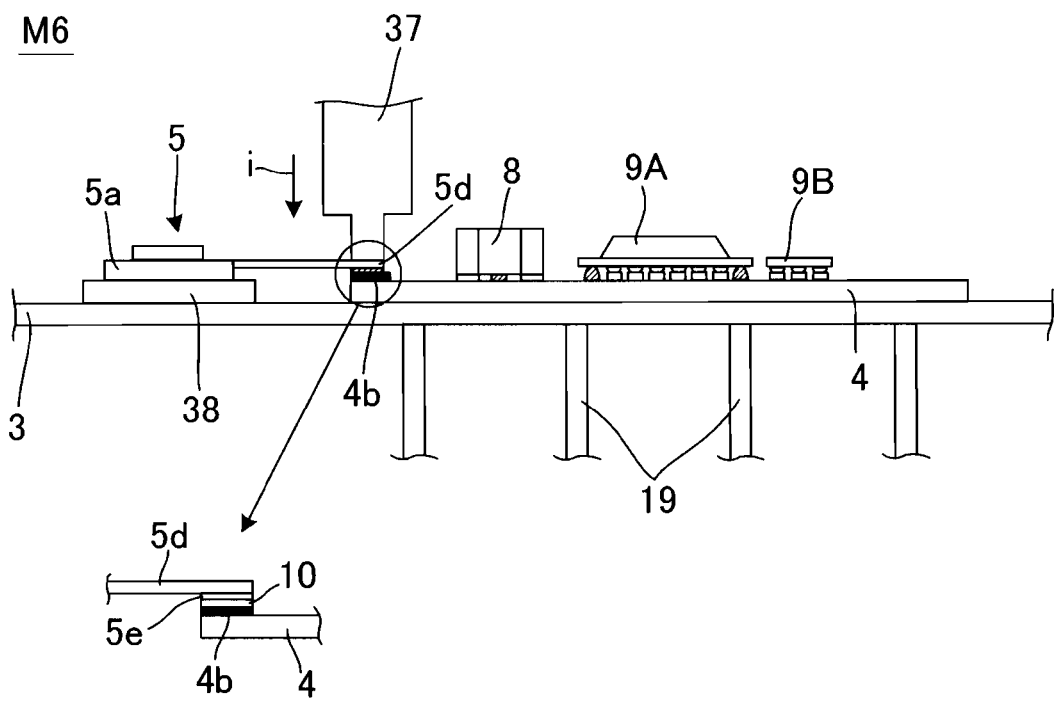
FIG. 12 is a process explanatory view of the electronic component mounting method in the electronic component mounting system according to an embodiment of the invention.

Next, the main substrate 4 is conveyed to the thermal compression device M6 along with the module substrate 5 placed on the holding jig 38, and the main substrate 4 with the module substrate 5 mounted thereon is heated to bond the flexible terminals 5e and the connection terminals 4b together by the bonding material 10 (heating step). That is, as shown in FIG. 12, the heating tool 37 heated to a predetermined temperature moves down with respect to the upper surface of the connection end portion 5d overlapping the connection terminals 4b (arrow i), and the main substrate 4 near the connection terminals 4b is heated for a predetermined time by the heating tool 37. Thus, the solder component contained in the bonding material 10 is molten to provide electrical conduction between the connection terminals 4b and the flexible terminals 5e. Simultaneously, the thermosetting resin which constitutes the bonding material 10 is thermally set to fix the connection end portion 5d to the mounting surface 4a of the main substrate 4. Thus, the flexible terminals 5e and the connection terminals 4b are bonded together by the bonding material 10. At this time, with the action of the active component mixed in the bonding material 10, an oxide film generated in the surfaces of the solder particles or the connection terminals 4b as a bonding target is removed, thereby ensuring satisfactory solder bondability.

As described above, the electronic component mounting system 1 described in this embodiment includes the component mounting section which at least includes the solder printing device M1 printing the cream solder 6 on the main substrate 4, the component mounting device M3 mounting the electronic components on the main substrate 4 with the cream solder 6 printed thereon, and the reflow device M4 heating the main substrate 4 with the electronic components mounted thereon to solder-bond the electronic components onto the main substrate 4, and performs the component mounting operation to mount the electronic components on the main substrate 4. The substrate conveying mechanism 3 of the component mounting section and the substrate conveying mechanism 3 of the substrate connection section which performs the substrate connection operation to connect the module substrate 5 to the main substrate 4 on which the mounting of the electronic components is completed are connected directly to each other or are linked to each other by a conveying path through another conveying means.

Thus, the main substrate 4 after reflow ends in the component mounting step is transferred immediately to the substrate connection step without being temporarily stacked as in the related art method. Therefore, the problem in the related art method, that is, the generation of a void in the connection portion due to moisture in the main substrate 4 by moisture absorption during the stacking time being evaporated in the substrate connection step can be excluded, thereby ensuring high connection reliability.

Although in the foregoing embodiment, an example has been described where the connection of the main substrate 4 and the module substrate 5 is carried out using the bonding material 10 in which solder particles are contained in thermosetting resin, the invention is not limited thereto. An ACF (anisotropic conductive material) in which conductive particles are contained in thermosetting resin may be used.

Although the invention has been described in detail or with reference to the specific embodiment, it should be apparent to those skilled in the art that various changes or alterations may be made without departing from the spirit and scope of the invention.

This application is based on Japanese Patent Application No. 2009-092616, filed on Apr. 7, 2009, the content of which is incorporated herein by reference.

Industrial Applicability

The electronic component mounting system and the electronic component mounting method of the invention have an advantage of ensuring high connection reliability, and it is useful in an electronic component mounting system which has a plurality of devices for electronic component mounting connected in series with each other, mounts an electronic component on a first substrate, and connects the first substrate and a second substrate to each other.

Reference Signs List
   1: electronic component mounting system
   3: substrate conveying mechanism
   4: main substrate (first substrate)
   4b: connection terminal (first connection portion)
   5: module substrate (second substrate)
   5a: sub substrate
   5c: flexible substrate
   5e: flexible terminal (second connection portion)
   6: cream solder (paste)
   8: chip-type component (electronic component)
   9A: bump-equipped component (electronic component)
   9B: bump-equipped component (electronic component)
   10: bonding material
   30: bonding material coating unit (bonding material supply section)
   32: mounting head (substrate mounting section)
   36: heating head (heating section)
   M1: solder printing device
   M2: coating/inspection device
   M3: component mounting device
   M4: reflow device
   M5: bonding material supply/substrate mounting device
   M6: thermal compression device

The invention claimed is:

1. An electronic component mounting system which has a plurality of devices for electronic component mounting connected in series with each other, mounts an electronic component on a first substrate, and connects the first substrate and a second substrate to each other, the electronic component mounting system, the plurality of devices for electronic component mounting comprising:

a component mounting section which at least includes a solder printing device printing paste for solder bonding on the first substrate, a component mounting device mounting the electronic component on the first substrate with the paste printed thereon, and a reflow device heating the first substrate with the electronic component mounted thereon to solder-bond the electronic component onto the first substrate, and performs a component mounting operation to mount the electronic component on the first substrate while conveying the first substrate along a substrate conveying path formed by connecting substrate conveying mechanisms respectively provided in the plurality of devices for electronic component mounting in series with each other; and a substrate connection section which has a substrate conveying mechanism whose conveying path is linked to the substrate conveying mechanism of the reflow device on the most downstream side in the component mounting section and performs a substrate connection operation to connect the second substrate to the first substrate on which the mounting of the electronic component is completed.

2. The electronic component mounting system according to claim 1, wherein the substrate connection section includes a bonding material supply section which supplies a bonding material, in which solder particles are contained in thermosetting resin, to a first connection portion provided in the first substrate, a substrate mounting section which mounts the second substrate on the first substrate to land a second connection portion provided in the second substrate on the first connection portion through the bonding material, and a heating section which heats the first substrate with the second substrate mounted thereon to bond the second connection portion and the first connection portion together by the bonding material.

3. An electronic component mounting method which mounts an electronic component on a first substrate and connects the first substrate and a second substrate to each other, the electronic component mounting method comprising:

a solder printing step of printing paste for solder bonding on the first substrate;

a component mounting step of mounting the electronic component on the first substrate with the paste printed thereon;

a reflow step of heating the first substrate with the electronic component mounted thereon to solder-bond the electronic component onto the first substrate; and a substrate connection step of connecting the second substrate to the first substrate on which the mounting of the electronic component is completed by the reflow step, wherein the solder printing step, the component mounting step, and the reflow step are performed by a component mounting section which is constituted by the same electronic component mounting line, and the substrate connection step is performed by a substrate connection section which has a substrate conveying mechanism whose conveying path is linked to a substrate conveying mechanism of a reflow device on the most downstream side in the component mounting section.

4. The electronic component mounting method according to claim 3, wherein the substrate connection step includes a bonding material supply step of supplying a bonding material, in which solder particles are contained in thermosetting resin, to a first connection portion of the first substrate to the second substrate, a substrate mounting step of mounting the second substrate on the first substrate to land a second connection portion provided in the second substrate on the first connection portion through the bonding material, and a heating step of heating the first substrate with the second substrate mounted thereon to bond the second connection portion and the first connection portion together by the bonding material.

* * * * *